United States Patent
Morishita et al.

(10) Patent No.: US 11,348,660 B1
(45) Date of Patent: May 31, 2022

(54) SEMICONDUCTOR DEVICE PERFORMING LOOP-BACK TEST OPERATION

(71) Applicant: MICRON TECHNOLOGY, INC., Boise, ID (US)

(72) Inventors: Yoshihito Morishita, Shibuya-ku (JP); Hiroshi Ichikawa, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/105,137

(22) Filed: Nov. 25, 2020

(51) Int. Cl.
  *G11C 11/4096* (2006.01)
  *G11C 29/52* (2006.01)
  *G11C 11/4093* (2006.01)

(52) U.S. Cl.
  CPC .......... *G11C 29/52* (2013.01); *G11C 11/4093* (2013.01); *G11C 11/4096* (2013.01)

(58) Field of Classification Search
  CPC .. G11C 29/52; G11C 11/4096; G11C 11/4093
  See application file for complete search history.

(56) References Cited

U.S. PATENT DOCUMENTS

| | | | | |
|---|---|---|---|---|
| 5,933,376 | A * | 8/1999 | Lee | G11C 29/785 365/200 |
| 6,016,525 | A * | 1/2000 | Corrigan | G06F 11/2221 710/100 |
| 9,043,662 | B2 * | 5/2015 | Selking | G11C 29/02 714/718 |
| 2004/0267479 | A1 * | 12/2004 | Querbach | G01R 31/31853 702/117 |
| 2006/0059394 | A1 * | 3/2006 | Spirkl | G11C 29/022 714/718 |
| 2006/0059397 | A1 * | 3/2006 | Brox | G11C 29/022 714/736 |
| 2010/0251042 | A1 * | 9/2010 | Selking | G11C 29/022 714/719 |
| 2015/0088437 | A1 * | 3/2015 | Lin | G11C 29/023 702/58 |
| 2019/0066816 | A1 * | 2/2019 | Dono | G11C 29/36 |

* cited by examiner

*Primary Examiner* — Jay W. Radke
(74) *Attorney, Agent, or Firm* — Dorsey & Whitney LLP

(57) ABSTRACT

Disclosed herein is an apparatus that includes a memory cell array; a data input/output terminal; a read data path and a write data path coupled in parallel between the memory cell array and the data input/output terminal, wherein the read data path includes a pre-driver and an output driver coupled in series, and wherein the write data path includes an input receiver and a latch circuit coupled in series; and a test path configured to provide a shortcut between the pre-driver in the read data path and the latch circuit in the write data path.

17 Claims, 7 Drawing Sheets

SEMICONDUCTOR DEVICE PERFORMING LOOP-BACK TEST OPERATION

BACKGROUND

Various operation tests are performed at a manufacturing step of a semiconductor device such as a DRAM (Dynamic Random Access Memory). In some operation tests, data that is output from an output buffer to a data I/O terminal is loop-backed to an input receiver. This enables test data to be written into a memory cell array without inputting the test data from the data. I/O terminal.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
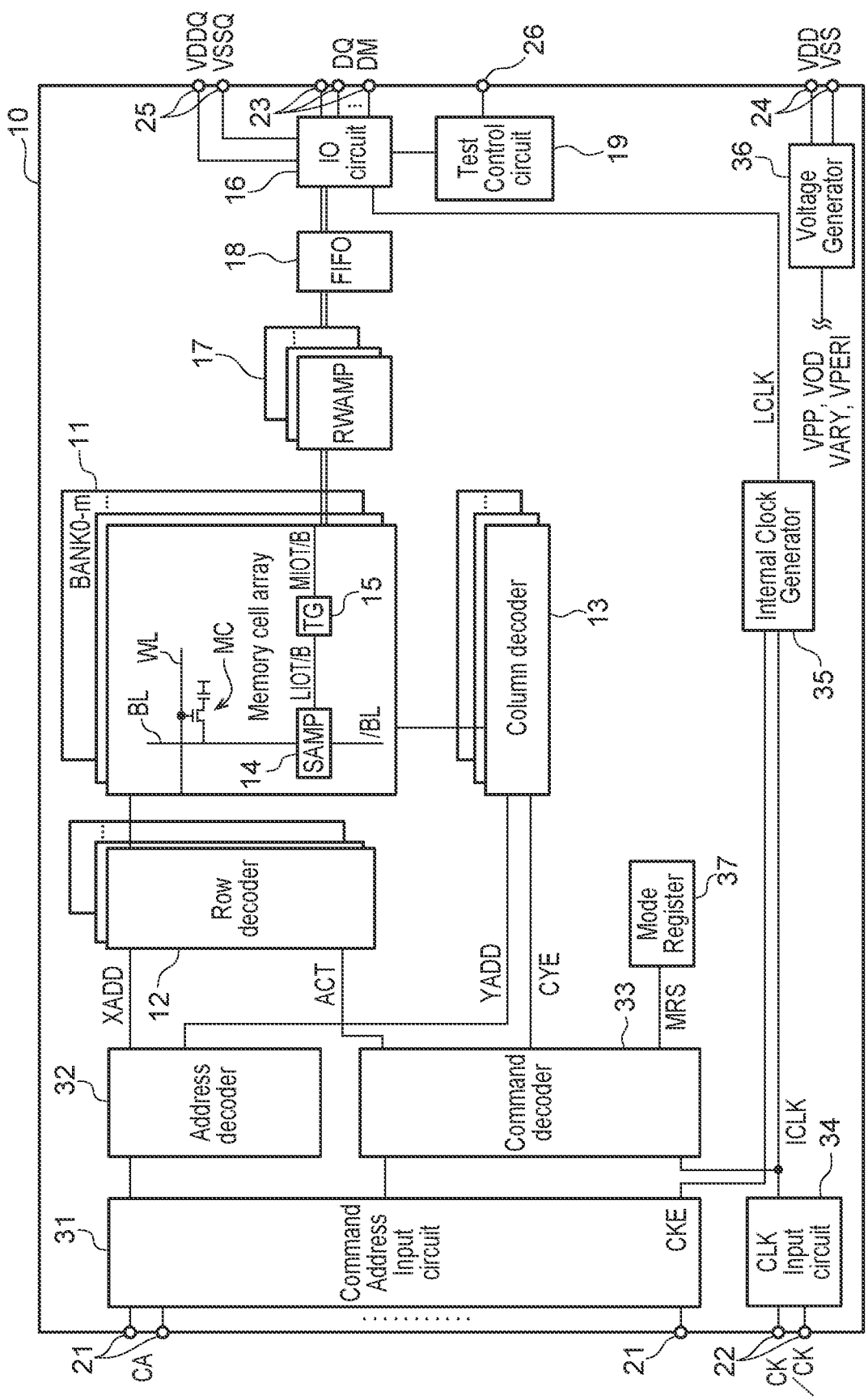
FIG. 1 is a block diagram of a semiconductor device according to an embodiment of the present disclosure.

FIG. 1 is a block diagram of a semiconductor device 10 according to one embodiment of the present disclosure. The semiconductor device 10 can be, for example, a wide I/O DRAM incorporated into a single semiconductor chip. As shown in FIG. 1, the semiconductor device 10 includes a memory cell array 11. The memory cell array 11 includes a plurality of word lines WL, a plurality of bit lines BL, and a plurality of memory cells MC respectively provided at intersections between the word lines WL and the bit lines BL. Selection of the word lines WL is performed by a row decoder 12 and selection of the bit lines BL is performed by a column decoder 13. A sense amplifier 14 is coupled to a corresponding one of the bit lines BL and a local I/O line pair LIOT/B. The local I/O line pair LIOT/B is coupled to a main I/O line pair MIOT/B via a transfer gate 15 that functions as a switch. The memory cell array 11 is divided into m+1 memory banks including memory banks BANK0 to BANKm.

A plurality of external terminals included in the semiconductor device 10 include a command address terminal 21, a clock terminal 22, a data terminal 23, power terminals 24, 25 and a test terminal 26. The data terminal 23 is coupled to an I/O circuit 16. The test terminal 26 is coupled to a test control circuit 19.

A command address signal CA is supplied to the command address terminal 21. A signal related to an address in the command address signal CA supplied to the command address terminal 21 is transferred to an address decoder 32 via a command address input circuit 31, and a signal related to a command is transferred to a command decoder 33 via the command address input circuit 31. The address decoder 32 decodes the address signal to generate a row address XADD and a column address YADD. The row address XADD is supplied to the row decoder 12 and the column address YADD is supplied to the column decoder 13. A clock enable signal CKE in the command address signal CA is supplied to an internal clock generator 35.

Complementary external clock signals CK and /CK are supplied to the clock terminal 22. The complementary external clock signals CK and /CK are input to a clock input circuit 34. The clock input circuit 34 generates an internal clock signal ICLK based on the complementary external clock signals CK and /CK. The internal clock signal ICLK is supplied to at least the command decoder 33 and the internal clock generator 35. The internal clock generator 35 is activated, for example, by the clock enable signal CKE and generates an internal clock signal LCLK based on the internal clock signal ICLK. The internal clock signal LCLK is supplied to the I/O circuit 16. The internal clock signal LCLK is used as a timing signal that defines a timing when read data DQ is to be output from the data terminal 23 in a read operation. In a write operation, write data is input from outside to the data terminal 23. A data mask signal DM may be input from outside to the data terminal 23 in the write operation.

Power potentials VDD and VSS are supplied to the power terminal 24. These power potentials VDD and VSS are supplied to a voltage generator 36. The voltage generator 36 generates various internal potentials VPP, VOD, VARY, VPERI, and the like based on the power potential VDD and VSS. The internal potential VPP is mainly used in the row decoder 12, the internal potentials VOD and VARY are mainly used in the sense amplifiers 14 included in the memory cell array 11, and the internal potential VPERI is used in other many circuit blocks.

Power potentials VDDQ and VSSQ are supplied from the power terminal 25 to the I/O circuit 16. Although the power potentials VDDQ and VSSQ can be same as the power potentials VDD and VSS supplied to the power terminal 24, respectively, dedicated power potentials VDDQ and VSSQ are allocated to the I/O circuit 16 to prevent power-supply noise that occurs in the I/O circuit 16 from propagating to other circuit blocks.

The command decoder 33 activates an active signal ACT when an active command is issued. The active signal ACT is supplied to the row decoder 12. When a read command or a write command is issued from outside following the active command, the command decoder 33 activates a column selection signal CYE. The column selection signal CYE is supplied to the column decoder 13 and a corresponding one of the sense amplifiers 14 is activated in response thereto. Accordingly, read data is read from the memory cell array 11 in the read operation. The read data having been read from the memory cell array 11 is transferred to the I/O circuit 16 via a read/write amplifier 17 and a FIFO (First-In First-Out) circuit 18 and is output from the data terminal 23 to outside. In the write operation, write data having been input from outside via the data terminal 23 is written into the memory cell army 11 via the I/O circuit 16, the FIFO circuit 18, and the read/write amplifier 17.

The command decoder 33 activates a mode register set signal MRS when a mode register set command is issued. The mode register set signal MRS is supplied to a mode register 37. When the mode register set signal MRS is activated, various control parameters stored in the mode register 37 are overwritten.

Figure 2:
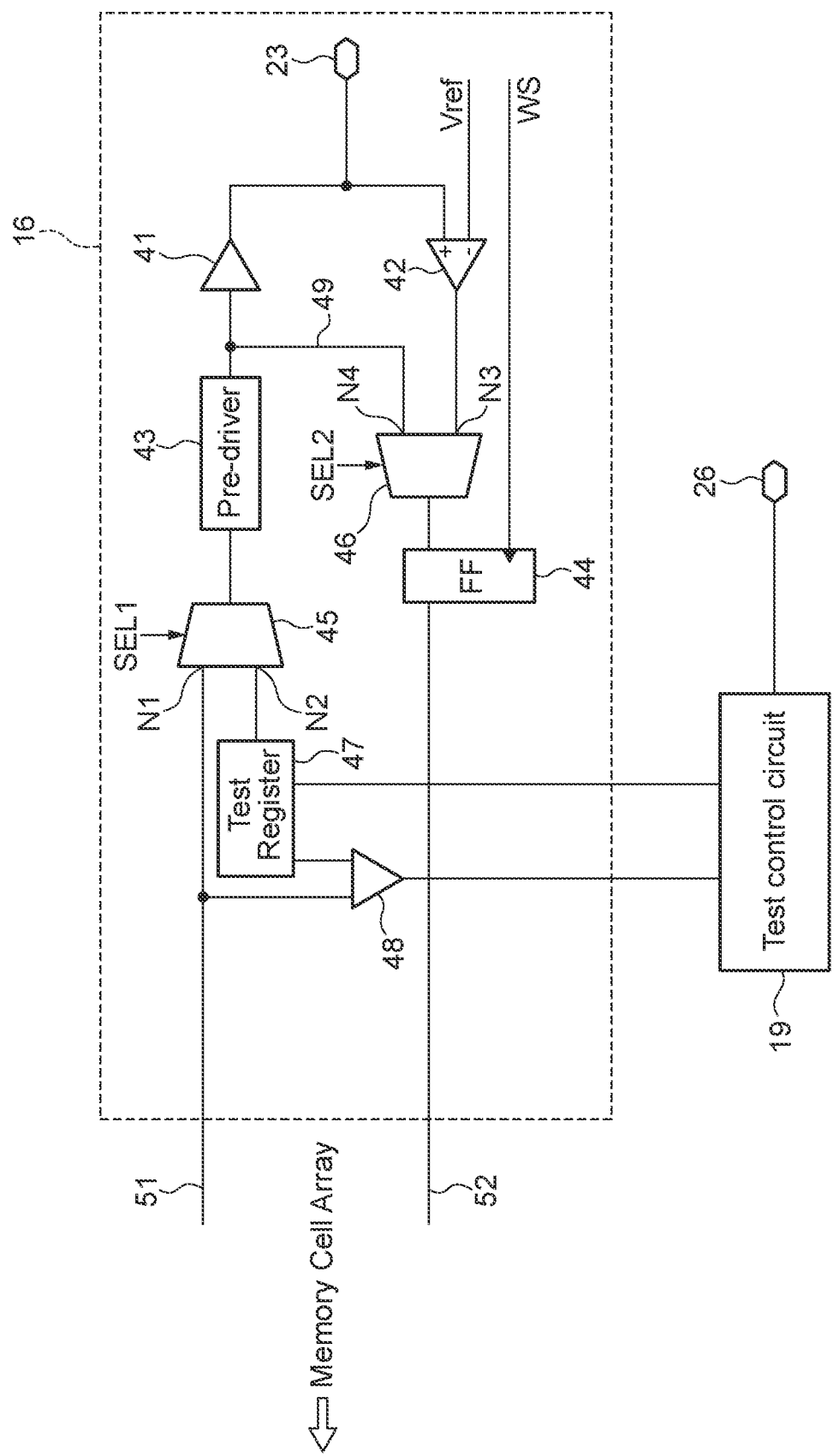
FIG. 2 is a circuit diagram of an I/O circuit.

As shown in FIG. 2, the I/O circuit 16 has an output buffer 41 and an input receiver 42. An output node of the output buffer 41 and an input node of the input receiver 42 are coupled to a corresponding one of the data terminals 23. The I/O circuit 16 further includes a pre-driver 43, a latch circuit 44, multiplexers 45 and 46, a test register 47, and a comparator 48. The multiplexer 45 couples one of input nodes N1 and N2 to the pre-driver 43 based on a selection signal SEL1. The multiplexer 46 couples one of input nodes N3 and N4 to the latch circuit 44 based on a selection signal SEL2. The selection signals SEL1 and SEL2 may be switched by the mode register 37 or may be switched by the test control circuit 19.

Figure 3:
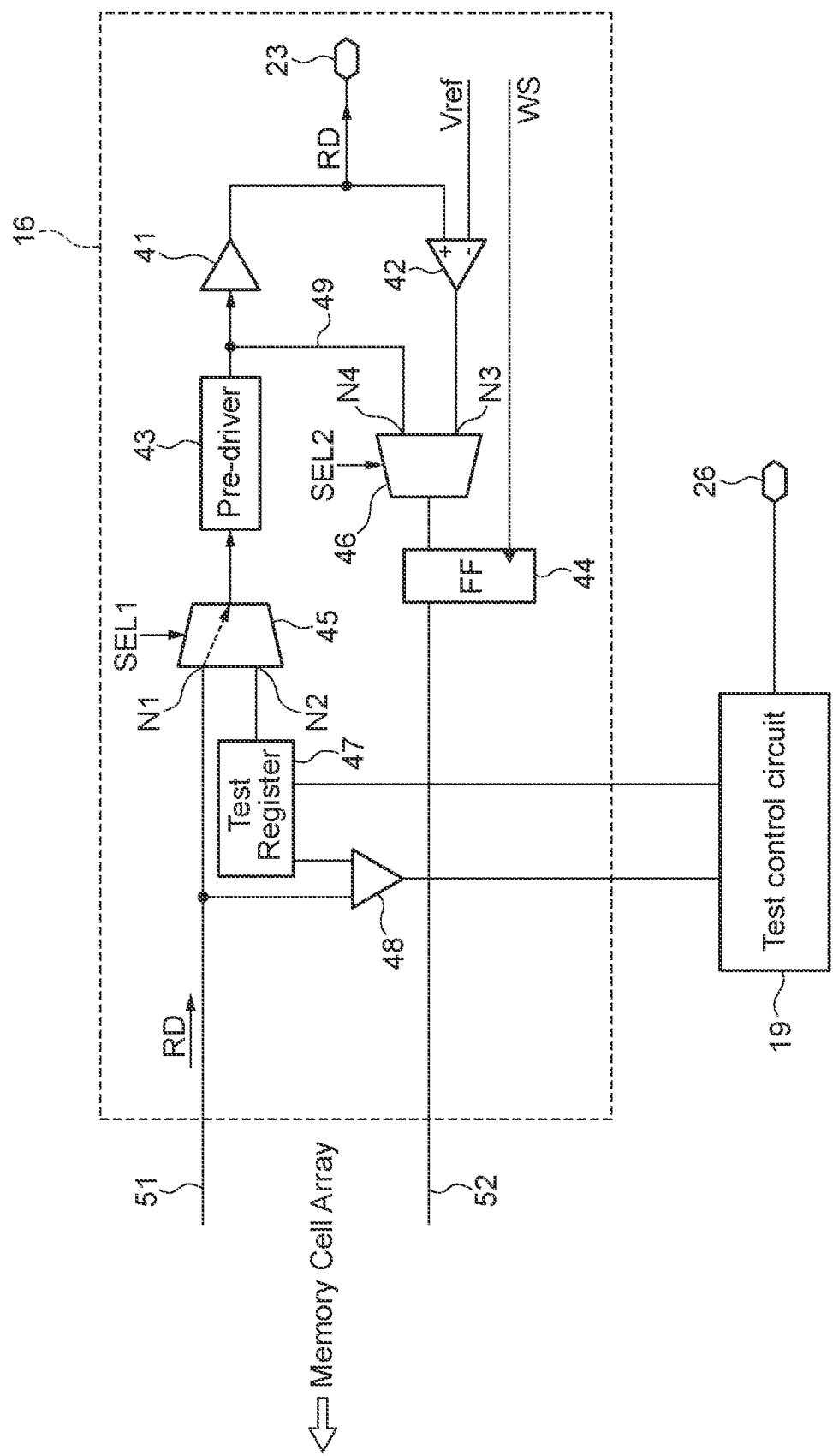
FIG. 3 is a diagram showing a flow of data of the I/O circuit in a read operation.

As shown in FIG. 3, the input node N1 of the multiplexer 45 is selected by the selection signal SEL1 in a normal read operation. Accordingly, read data RD that is read from the memory cell array 11 is supplied to the output buffer 41 via a read data path 51, the multiplexer 45, and the pre-driver 43. This enables the read data RD to be output to outside via the data terminal 23. This operation is also performed similarly in a read test operation using the data terminal 23 as well as in the normal read operation. With this read test operation, whether the memory cell array 11, the read data path 51, the multiplexer 45, the pre-driver 43, and the output buffer 41 operate normally can be evaluated.

Figure 4:
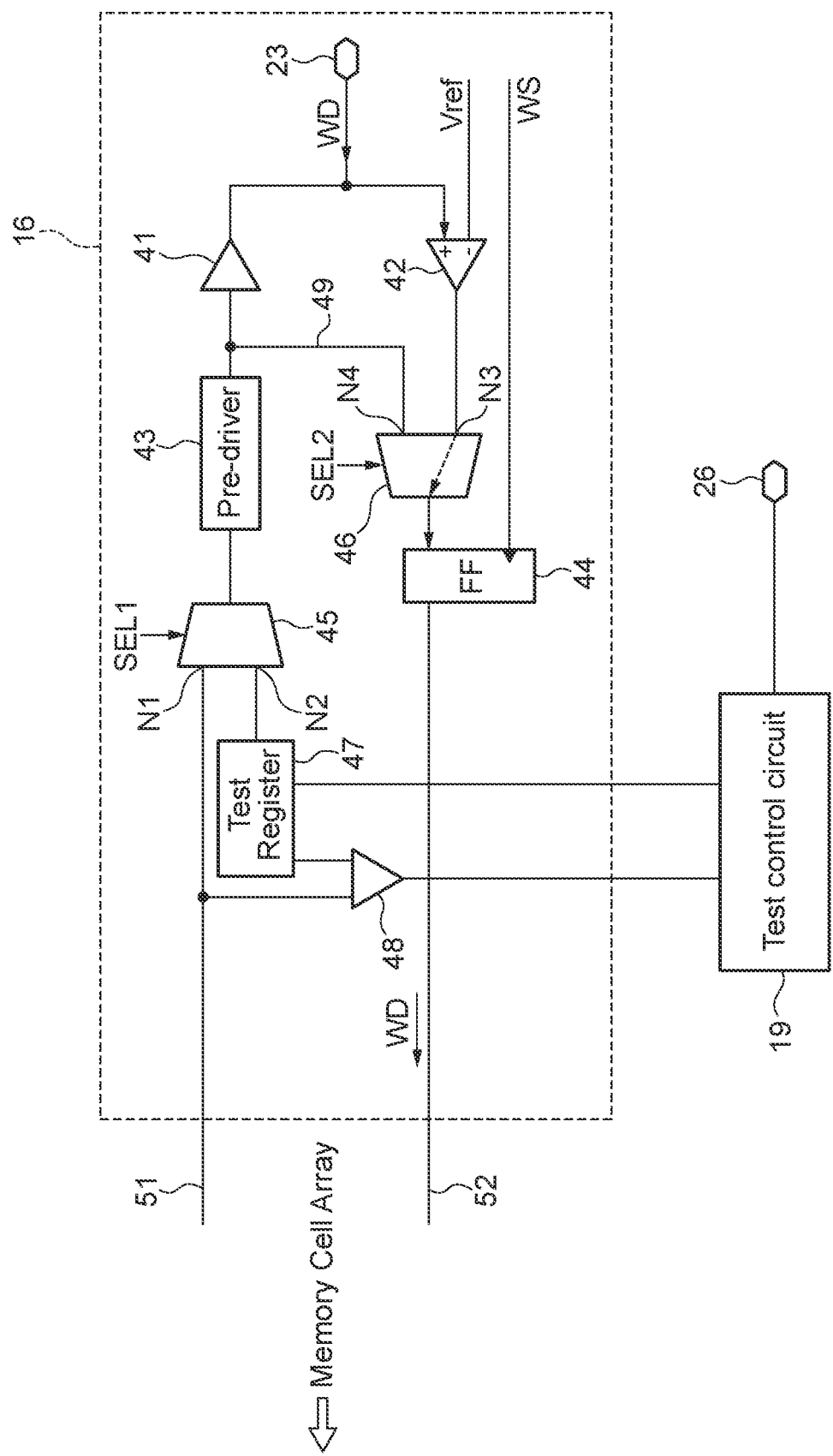
FIG. 4 is a diagram showing a flow of data of the I/O circuit in a write operation.

As shown in FIG. 4, the input node N3 of the multiplexer 46 is selected by the selection signal SEL2 in a normal write operation. Accordingly, write data WD input from outside to the data terminal 23 is latched by the latch circuit 44 via the input receiver 42 and the multiplexer 46. The write data WD latched by the latch circuit 44 is transferred to the memory cell array 11 via a write data path 52 and is written into the memory cell army 11. This operation is also performed similarly in a write test operation using the data terminal 23 as well as in the normal write operation. With this write test operation, whether the input receiver 42, the multiplexer 46, the latch circuit 44, and the write data path 52 operate normally can be evaluated. The input receiver 42 compares the level of the write data WD supplied to the data terminal 23 with a reference level Vref and generates internal write data based on a result of the comparison. The latch circuit 44 latches the internal write data in synchronization with a write strobe signal WS.

The semiconductor device 10 according to the present embodiment also can perform the write test operation and the read test operation without using the data terminals 23. In this case, test data used in the write test operation is set into the test register 47. Setting of test data into the test register 47 is performed by the test control circuit 19. The test control circuit 19 is coupled to a test terminal 26 and can accordingly set the test data without using the data terminals 23. The test data output from the test register 47 is loop-backed in the I/O circuit 16 and is written into the memory cell array 11 via the write data path 52. The semiconductor device 10 according to the present embodiment has two loop-back paths. A first loop-back path passes through the output buffer 41 and the input receiver 42. The first loop-back path is coupled to the data terminal 23. The first loop-back path is selected at the time of a low-speed test. The second loop-back path bypasses the output buffer 41 and the input receiver 42. The second loop-back path may be free from the data terminal 23. The second loop-back path bypasses the first loop-back path. The second loop-back path is selected at the time of a high-speed test. For example, the second loop-back path is selected for a test operation that is performed at a higher speed than a test operation when the first loop-back path is selected.

Figure 5:
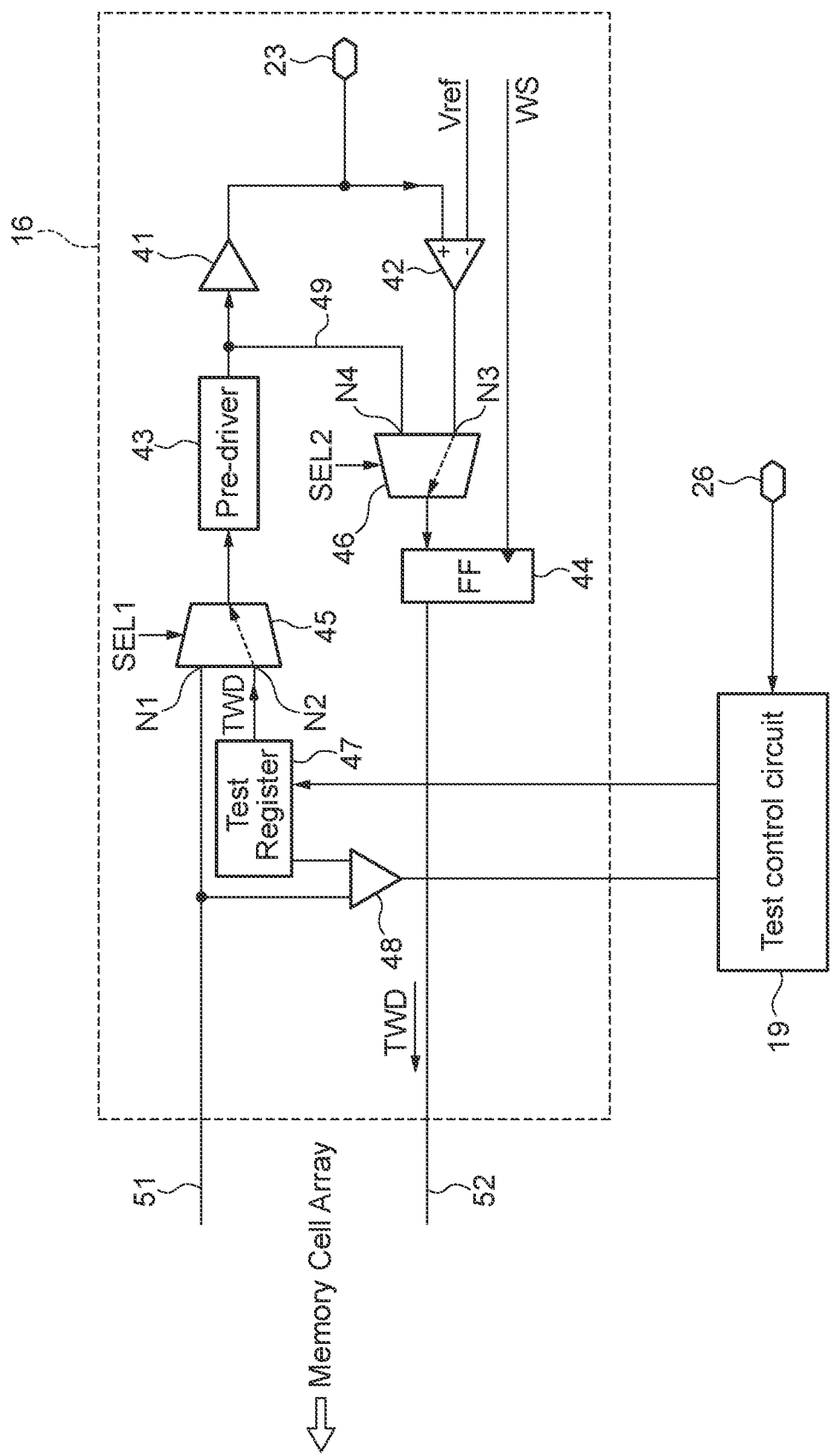
FIG. 5 is a diagram showing a flow of data of the I/O circuit in a low-speed write test operation.
Figure 6:
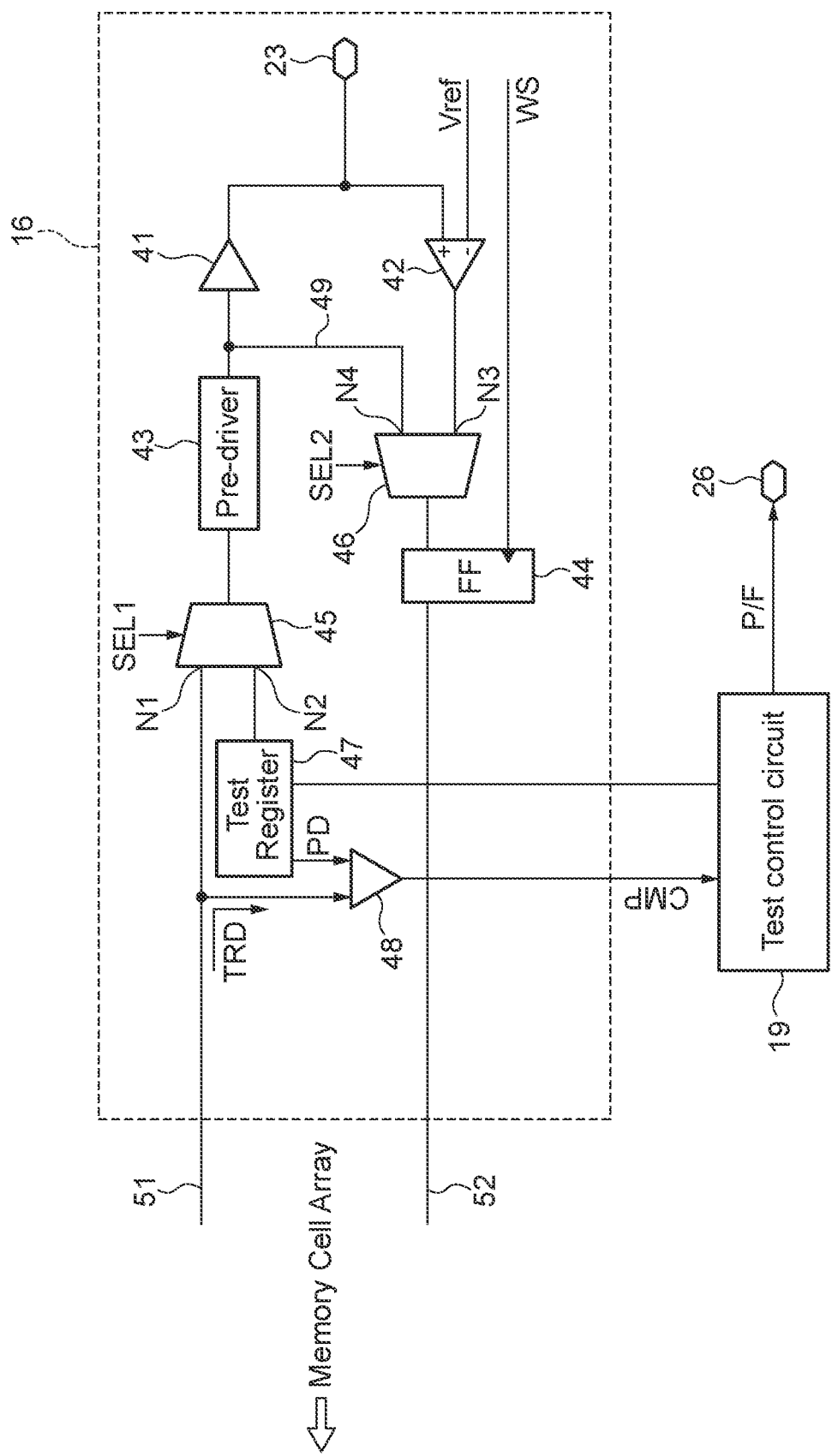
FIG. 6 is a diagram showing a flow of data of the I/O circuit in a read test operation.

At the time of a low-speed test, the input node N2 of the multiplexer 45 is selected by the selection signal SEL1 and the input node N3 of the multiplexer 46 is selected by the selection signal SEL2 as shown in FIG. 5. When test write data TWD is output from the test register 47 in this state, the test write data TWD is latched by the latch circuit 44 via the multiplexer 45, the pre-driver 43, the output buffer 41, the input receiver 42, and the multiplexer 46. The test write data TWD latched by the latch circuit 44 is transferred to the memory cell array 11 via the write data path 52 and is written into the memory cell array 11. With this write test operation, whether the multiplexer 45, the pre-driver 43, the output buffer 41, the input receiver 42, the multiplexer 46, the latch circuit 44, and the write data path 52 operate normally can be evaluated. Next, test read data TRD is read from the memory cell array 11 as shown in FIG. 6. The test read data TRD is compared by the comparator 48 with an expected value PD preset in the test register 47. The comparator 48 compresses a comparison result to generate a comparison result signal CMP. The comparison result signal CMP is supplied to the test control circuit 19. The test control circuit 19 generates a pass/fail signal P/F based on the comparison result signal CMP and outputs the pass/fail signal P/F to outside via the test terminal 26. With this read test operation, whether the memory cell array 11 and the read data path 51 operate normally can be evaluated.

In this way, at the time of a low-speed test, circuits of a data input/output system including the output buffer 41 and the input receiver 42 can be tested without using the data terminals 23. Accordingly, even in a case in which the number of the data terminals 23 is significantly large, the operation test can be performed in a wafer state by probing the test terminal 26 without probing the data terminals 23. However, because the test write data TWD passes through the output buffer 41 and the input receiver 42 at the time of a low-speed test, it is difficult to perform a high-speed operation similar to that in the normal operation. This is because the floating capacity of the data terminals 23 is large and the signal quality of the test write data TWD output from the output buffer 41 is different from the signal quality of the write data WD at the time of the normal operation.

Figure 7:
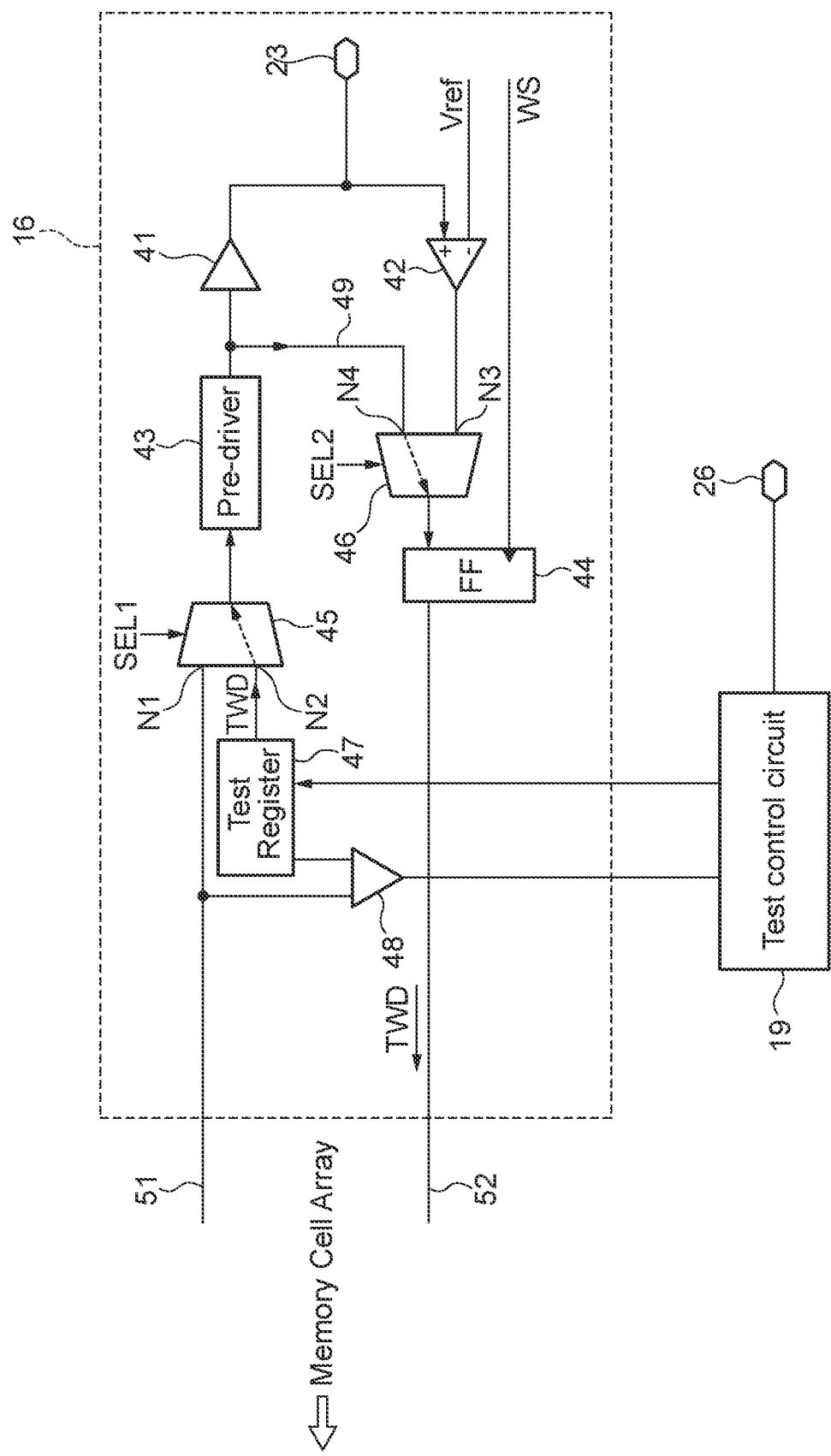
FIG. 7 is a diagram showing a flow of data of the I/O circuit in a high-speed write test operation.

At the time of a high-speed test, the input node N2 of the multiplexer 45 is selected by the selection signal SEL1 and the input node N4 of the multiplexer 46 is selected by the selection signal SEL2 as shown in FIG. 7. This enables an output from the pre-driver 43 to bypass through the test path 49 to the latch circuit 44. For example, the test path provides a shortcut between the pre-driver 43 and the latch circuit 44. When the test write data TWD is output from the test register 47 in this state, the test write data TWD is latched by the latch circuit 44 via the multiplexer 45, the pre-driver 43, and the multiplexer 46. The test write data TWD latched by the latch circuit 44 is transferred to the memory cell array 11 via the write data path 52 and is written into the memory cell array 11. With this write test operation, whether the multiplexer 45, the pre-driver 43, the multiplexer 46, the latch circuit 44, and the write data path 52 operate normally can be evaluated. Thereafter, the test read data TRD read from the memory cell array 11 is compared by the comparator 48 with the expected value PD and the pass/fail signal P/F is generated by the test control circuit 19 as explained with reference to FIG. 6, which enables to evaluate whether the memory cell array 11 and the read data path 51 operate normally.

In this way, at the time of a high-speed test, circuits of the data input/output system except for the output buffer 41 and the input receiver 42 can be tested without using the data terminals 23. Therefore, even in a case in which the number of the data terminals 23 is significantly large, the operation test can be performed in a wafer state by probing the test terminal 26 without probing the data terminals 23. Furthermore, because the test write data TWD bypasses the output buffer 41 and the input receiver 42 at the time of a high-speed test, a high-speed operation similar to that in the normal operation can be performed.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a memory cell array;
a data input/output terminal;
a read data path and a write data path coupled in parallel between the memory cell array and the data input/output terminal, wherein the read data path includes a pre-driver and an output buffer coupled in series, and wherein the write data path includes an input receiver and a latch circuit coupled in series;
a first test path configured to provide a shortcut between the pre-driver in the read data path and the latch circuit in the write data path; and
a second test path configured to provide a shortcut between the memory cell array and a test control circuit, wherein data output from the memory cell array bypasses the read data path through the second test path in a read test operation.

2. The apparatus of claim 1, wherein data output from the pre-driver bypasses the output buffer and the input receiver through the first test path in a first test operation.

3. The apparatus of claim 2, wherein data output from the pre-driver loop-backs to the latch circuit via the output buffer and the input receiver in a second test operation.

4. The apparatus of claim 3, wherein the first test operation is performed at higher speed than the second test operation.

5. The apparatus of claim 1, further comprising a first multiplexer coupled between the input receiver and the latch circuit,
wherein the first multiplexer has a first input node coupled to the input receiver, a second input node coupled to the pre-driver via the first test path, and an output node coupled to the latch circuit.

6. The apparatus of claim 5, further comprising a comparator, a test register, and a second multiplexer,
wherein the comparator has a first input node coupled to the test register, a second input node coupled to the memory cell array via the second test path, and an output node coupled to the test control circuit, and
wherein the second multiplexer has a first input node coupled to the memory cell array, a second input node coupled to the test register, and an output node coupled to the pre-driver.

7. The apparatus of claim 6, wherein data output from the memory cell array is supplied to the pre-driver via the second multiplexer in a third test operation.

8. The apparatus of claim 7, wherein data output from the test register is supplied to the pre-driver via the second multiplexer in a fourth test operation.

9. The apparatus of claim 8,
wherein the test control circuit is configured to set in the test register the data output from the test register and to generate a pass/fail signal based on data supplied from the comparator.

10. The apparatus of claim 9, further comprising a test terminal coupled to the test control circuit,
wherein the test control circuit is configured to set the data into the test register based on test data supplied from the test terminal, and
wherein the test terminal is configured to output the pass/fail signal.

11. An apparatus comprising:
a memory cell array;
a test register configured to store test data;
a read data path transmitting the test data supplied from the test register;
a write data path transmitting the test data to be written into the memory cell array;
an external terminal;
first and second loop-back paths configured to loop-back the test data from the read data path to the write data path,
wherein the first loop-back path is coupled to the external terminal, and
wherein the second loop-back path is free from the external terminal; and
a test read data path configured to bypass the read data path.

12. The apparatus of claim 11, further comprising:
an output buffer configured to output the test data to the external terminal; and
an input receiver configured to receive the test data from the external terminal,
wherein the first loop-back path includes the output buffer and the input receiver.

13. The apparatus of claim 12, wherein the second loop-back path is configured to loop-back the test data from the read data path to the write data path without passing through the output buffer and the input receiver.

14. The apparatus of claim 13, wherein the first loop-back path is selected in a first test operation.

15. The apparatus of claim 14, wherein the second loop-back path is selected in a second test operation.

16. The apparatus of claim 15, wherein the second test operation is performed at higher speed than the first test operation.

17. The apparatus of claim 16, wherein the second test operation is performed in a wafer state.

\* \* \* \* \*